(12) United States Patent
Yuval

(10) Patent No.: US 6,535,898 B1
(45) Date of Patent: Mar. 18, 2003

(54) FAST FLOATING-POINT TRUNCATION TO INTEGER FORM

(75) Inventor: Gideon A. Yuval, Mercer Island, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/490,247

(22) Filed: Jan. 24, 2000

(51) Int. Cl.[7] .................................................. G06F 5/00
(52) U.S. Cl. ........................ 708/204; 708/497; 708/551
(58) Field of Search ................................. 708/204, 497, 708/551

(56) References Cited

U.S. PATENT DOCUMENTS

| | | | | |
|---|---|---|---|---|
| 5,561,615 A | * | 10/1996 | Kuo et al. .................. | 708/204 |
| 5,995,122 A | * | 11/1999 | Hsieh et al. ................ | 345/505 |
| 6,131,104 A | * | 10/2000 | Oberman .................... | 708/204 |
| 6,292,815 B1 | * | 9/2001 | Abdallah et al. ........... | 708/204 |
| 2002/0087609 A1 | * | 7/2002 | Zohar ......................... | 708/497 |

* cited by examiner

*Primary Examiner*—David H. Malzahn
(74) *Attorney, Agent, or Firm*—Merchant & Gould (57) ABSTRACT

A processor representation of a floating-point data item is converted to a representation of a truncated integer item, without changing the rounding mode of a processor. When the current rounding mode is unknown, the floating-point item is converted to an integer representation in whatever mode the processor happens to be in. One of multiple correction values is applied, in response to the sign of the original data, a difference between the integer and the original data, and whether the item is an integer. When the current rounding mode is known, the processor produces two integer representations, and selects one or the other of them as an output integer data item, in response to the sign of the original item and the relative sizes of the two representations.

40 Claims, 5 Drawing Sheets

| | | | |
|---|---|---|---|
| 410 | | 453 | neg eax |
| 411 | extern "C" | 454 | cdq |
| 412 | __declspec(naked) _cdecl _ftol(double f) { | 460 | |
| 413 | __asm { | 461 | mov ecx,dword ptr [ebp-12] |
| 420 | | 462 | xor ebx,ecx |
| 421 | fld st(0) | 463 | add ebx,ebx |
| 422 | push ebp | 464 | sbb ebx,ebx |
| 423 | mov ebp,esp | 465 | not ebx |
| 430 | | 466 | and eax,ebx |
| 431 | and ebp,-8 | 467 | and edx,ebx |
| 432 | fistp qword ptr [ebp-8] | 470 | |
| 433 | fst dword ptr[ebp-16] | 471 | sub ecx,1 |
| 434 | fild qword ptr [ebp-8] | 472 | sbb ecx,ecx |
| 435 | fxch st(1) | 473 | not ecx |
| 436 | mov eax,dword ptr [ebp-16] | 474 | and eax,ecx |
| 437 | mov ebx,eax | 475 | and edx,ecx |
| 440 | | 476 | add eax,dword ptr [ebp-8] |
| 441 | fsub | 477 | adc edx,dword ptr [ebp-4] |
| 442 | add eax,eax | 480 | |
| 443 | sbb eax,eax | 481 | pop ebp |
| 444 | fstp dword ptr [ebp-12] | 482 | ret 0 |
| 450 | | 483 | } |
| 451 | add eax,eax | 484 | }} |
| 452 | inc eax | | |

FIG. 6

610
611  extern "C"
612  __declspec(naked) _cdecl _ftol(double f) {
613  int rmi,rpl;
614  __asm {
620
621  fcom dword ptr zero
622  push ebp
623  fnstsw ax
624  mov ebp,esp
625  test ah,1
626  jne negative
630
632  fst st(1)
633  fadd dword ptr half
634  fxch
635  fsub dword ptr half
636  fxch
637  fistp rpl
638  fistp rmi
640
641  mov ebx,rpl
642  dec ebx
643  mov eax,rmi
644  cmp eax,ebx
645  sbb ebx,ebx
646  sub eax,ebx
650
651  pop ebp
652  ret 0
660
661  negative
662  fst st(1)
663  fsub dword ptr half
664  fxch
665  fadd dword ptr half
666  fxch
667  fistp rmi
668  fistp rpl
670
671  mov ebx,rmi
672  inc ebx
673  mov eax,rpl
674  cmp ebx,eax
675  sbb ebx,ebx
676  add eax,ebx
680
681  pop ebp
682  ret 0
683  }
684  }}

FAST FLOATING-POINT TRUNCATION TO INTEGER FORM

TECHNICAL FIELD

The present invention relates to electronic data processing, and more particularly concerns the conversion of individual numeric data items from floating-point form to integer form in a computer.

COPYRIGHT

A portion of the disclosure of this patent document contains material which is subject to copyright protection. The copyright owner has no objection to the facsimile reproduction of the patent document or the patent disclosure as it appears in the Patent and Trademark Office patent file or records, but otherwise reserves all copyright rights whatsoever. The following notice applies to the software and data described herein: "Copyright© 1999, Microsoft Corp., all rights reserved."

BACKGROUND

A computer represents numeric data items in two types of format. Floating-point formats employ a form of scientific notation to encode a number such as $-0.777328 \times 10^{34}$. Floating-point data formats allow very large and very small numbers to be encoded, and permit consistent precision for numbers having a very great range of magnitudes. Typically, a processing engine's internal floating-point format includes a sign bit or field to distinguish between positive and negative numbers, a relatively short exponent or characteristic field to signify a power of a base (usually '2'), and a longer significand, fraction, or mantissa field to specify certain significant digits of the number with an implied fixed point, usually near the first digit. Some conventional formats allow denormalized significands, contain another bit or field that can specify a position for a decimal, binary, or other point, and include facilities for indicating whether the contents represent a valid number. A single engine may support multiple floating-point formats, either by explicit mode switching, by internal conversion, by codes in the data items themselves, or by other means. The prevalent format at the present time is found in the ANSI/IEEE-754 standard dated 1985. A later -854 revision is not yet widely used.

Fixed-point data items employ a certain number of bits to represent numbers with points at an implied location in the bit pattern. When, as is the usual case, the point is implied after the least-significant digit, the data items represent whole numbers, or integers. The terms fixed-point and integer are usually used synonymously. Although integer data cannot represent as wide a range of values, arithmetical operations on them are much easier and much faster in a computer. Different processors support different lengths and/or types of integers, and the same processor frequently supports multiple lengths, such as 8-bit bytes, 16-bit words, 32-bit double words, 64-bit quad words, and even 16-byte frames.

Conversion between floating-point and integer representations of the same number is frequently necessary. Because floating-point values often cannot be represented exactly in the integer format, some method of rounding to a nearest integer is required. Several different methods or modes are in common use, and each has multiple names.

Nearest, or round-to-even, mode selects the nearest of two adjacent integer values. If neither is nearer, then the even value is chosen.

Positive-infinity, or ceiling, mode selects the integer equal to or more positive than the floating value.

Negative-infinity, or floor, mode chooses the integer equal to or more negative than the floating value.

Truncate, chop, or zero, mode rounds to the integer that is closest to zero. That is, it merely drops any fractional part.

Different applications and different languages may prefer or mandate one of these modes. Therefore, a processing engine of any generality must be able to convert numbers using multiple modes. The most common implementation, from microprocessors to mainframes, is to provide a machine-level instruction that converts one floating-point data item to one integer item, and to provide another instruction to set a flag or register that specifies which of several rounding modes is to be used in the conversion. This is an optimum strategy for many purposes, because any single program almost always uses only one rounding mode throughout its execution. Even though the instruction that changes the mode is often agonizingly slow (e.g., 60–70 machine cycles, slower than a floating-point division operation), it need only be executed once for an entire execution of a program. To accommodate multi-tasking, the current mode can be incorporated into a machine state that is saved and restored when the processor switches among tasks.

The truncate mode was the first rounding method. It is simplicity itself to implement: any fractional part of a number is simply lopped off and discarded. Many graphics algorithms still employ truncation, for historical reasons and also for its fast execution. The Bresenham algorithm for drawing a line or circle on a raster display, for example, uses truncation of any floating-point values that specify the line position. This algorithm is described in many classic texts, such as Foley and Van Dam, Fundamentals of Interactive Computer Graphics (First Ed., 1983), pp. 433–436 and 442–445. Graphics is a sufficiently common requirement in so many areas of computer usage, and truncation occurs so often in so many graphics computations, that the efficiency of its implementation is of prime importance.

On the other hand, most modem languages and application programs prefer, or even mandate, another mode; round-to-even currently enjoys a large lead. It is almost always impractical to set truncate mode only for those routines that use it, and then reset it for the remainder of a program. It is also not usually possible to find out what mode is currently in force in a program. The mode can be set, but cannot be easily read. Also, many modem machines have out-of-order or non-sequential execution of instructions on a real-time basis that varies for each run, and they pipeline instructions for execution at unpredictable times. A processor must clear out all execution units and pipeline stages before setting a new rounding mode, in order to guarantee that the new mode will not incorrectly operate upon previously launched instructions. This hardware must then fill again with new instructions, before further useful work can be performed. Even older processors decouple the floating-point hardware from the integer-unit's timing sufficiently that exceptions, mode changes, and so forth within the floating-point unit bog down the entire processor for relatively long periods of time.

Therefore, even when processors allow multiple rounding modes, and even though some need only two instructions to switch modes, the amount of time required to accomplish a switch appreciably slows the processor for common tasks such as drawing graphics objects. A much more efficient truncation method would be beneficial in programming environments.

SUMMARY OF THE INVENTION

The present invention provides methods for converting processor representations of floating-point data items to corresponding representations of truncated integer items in an efficient manner. Significant time savings are achieved without setting and resetting a mode register in the processor. A basic implementation operates without any knowledge of which conversion mode a processor is currently using, by converting a floating-point data item to an integer representation in whatever mode the processor happens to be in, then introducing one of multiple correction values to the integer representation in response to the sign of the original data and a difference between the integer and the original data. When the conversion mode is known to be in a particular state, another implementation detects the sign of the data item, and, in response thereto, produces two different integer representations from the data item and selects one or the other of them as an output integer data item. Conversions according to the invention further reduce execution time by minimizing or totally eliminating the use of conditional jumps or branches. Low-level machine instructions that are common to many different processor architectures makes the conversions both fast and general.

DETAILED DESCRIPTION

This description and the accompanying drawing illustrate specific examples of embodiments in which the present invention can be practiced, in sufficient detail to allow those skilled in the art to understand and practice the invention. Other embodiments, including logical, electrical, and mechanical variations, are within the skill of the art. Skilled artisans will also recognize features and advantages of the invention other than those explicitly set forth. The scope of the invention is to be defined only by the appended claims, and not by the specific embodiments described below.

Environment

Figure 1:
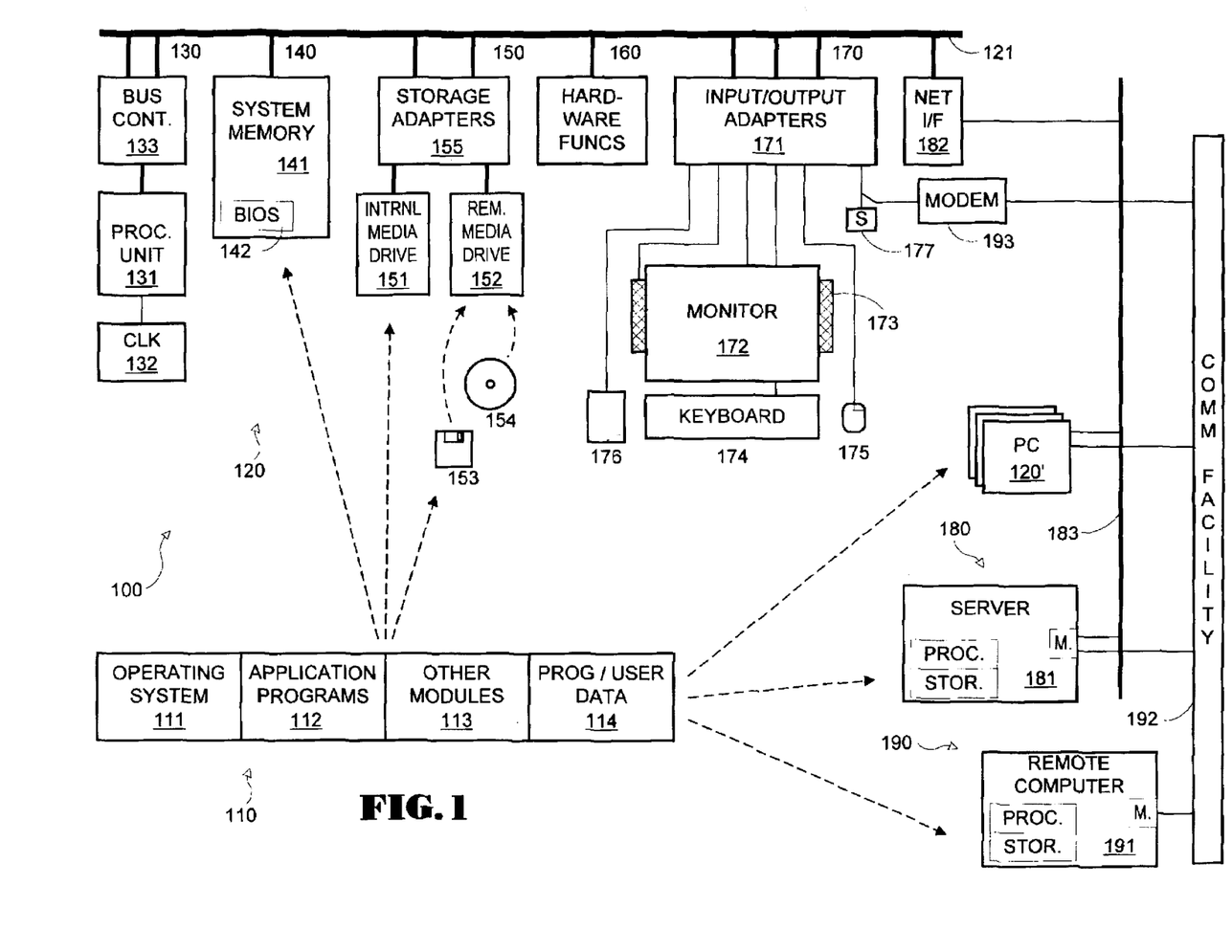
FIG. 1 is a high-level block diagram of an illustrative environment for the invention.

FIG. 1 is a high-level diagram of an illustrative environment 100 having software 110 and hardware 120 for hosting the invention as executable instructions, data, and/or electronic and mechanical components. Other suitable environments, and variations of the described environment are also possible.

Hardware components 120 are shown as a conventional personal computer (PC) including a number of components coupled together by one or more system buses 121 for carrying instructions, data, and control signals. These buses may assume a number of forms, such as the conventional ISA, PCI, and AGP buses. Some or all of the units coupled to a bus can act as a bus master for initiating transfers to other units. Processing unit 130 may have one or more microprocessors 131 driven by system clock 132 and coupled to one or more buses 121 by controllers 133. Internal memory system 140 supplies instructions and data to processing unit 130. High-speed RAM 141 stores any or all of the elements of software 110. ROM 142 commonly stores basic input/output system (BIOS) software for starting PC 120 and for controlling low-level operations among its components. Bulk storage subsystem 150 stores one or more elements of software 110. Hard disk drive 151 stores software 110 in a nonvolatile form. Drives 152 read and write software on removable media such as magnetic diskette 153 and optical disc 154. Other technologies for bulk storage are also known in the art. Adapters 155 couple the storage devices to system buses 121, and sometimes to each other directly. Other hardware units and adapters, indicated generally at 160, may perform specialized functions such as data encryption, signal processing, and the like, under the control of the processor or another unit on the buses.

Input/output (I/O) subsystem 170 has a number of specialized adapters 171 for connecting PC 120 to external devices for interfacing with a user. A monitor 172 creates a visual display of graphic data in any of several known forms. Speakers 173 output audio data that may arrive at an adapter 171 as digital wave samples, musical-instrument digital interface (MIDI) streams, or other formats. Keyboard 174 accepts keystrokes from the user. A mouse or other pointing device 175 indicates where a user action is to occur. Block 176 represents other input and/or output devices, such as a small camera or microphone for converting video and audio input signals into digital data. Other input and output devices, such as printers and scanners commonly connect to standardized ports 177. These ports include parallel, serial, SCSI, USB, FireWire, and other conventional forms.

Personal computers frequently connect to other computers in networks. For example, local area network (LAN) 180 connect PC 120 to other PCs 120' and/or to remote servers 181 through a network adapter 182 in PC 120, using a standard protocol such as Ethernet or token-ring. Although FIG. 1 shows a physical cable 183 for interconnecting the LAN, wireless, optical, and other technologies are also available. Other networks, such as wide-area network (WAN) 190 can also interconnect PCs 120 and 120', and even servers 181, to remote computers 191. Computers 181 and 191 have processors, storage, and communications equipment similar to those of PC 120, although usually of higher capacity. FIG. 1 illustrates a communications facility 192 such as a public switched telephone network for a WAN 190 such as an intranet or the internet. PC 120 can employ an internal or external modem 193 coupled to serial port 177. Other technologies such as packet-switching ISDN, ATM, DSL, frame-relay are also available. In a networked or distributed-computing environment, some of the software 110 may be stored on the other peer PCs 120', or on computers 181 and 191, each of which has its own storage devices and media.

Software elements 110 may be divided into a number of types whose designations overlap to some degree. For example, the previously mentioned BIOS sometimes includes high-level routines or programs which might also be classified as part of an operating system (OS) in other settings. The major purpose of OS 111 is to provide a software environment for executing application programs 112 and for managing the resources of system 100. An OS such as Microsoft® Windows® or Windows NT® commonly implements high-level application-program interfaces (APIs), file systems, communications protocols, input/output data conversions, and other functions.

Application programs 112 perform more direct functions for the user. A user normally calls them explicitly, although they can execute implicitly in connection with other applications or by association with particular data files or types. Modules 113 are packages of executable instructions and data which may perform functions for OSs 111 or for applications 112. Dynamic link libraries (.dll) and class definitions, for instance, supply functions to one or more programs. Data 114 includes user data of all types, data generated and/or stored by programs, and digital data that third parties make available on media or by download for use in computer 120. Software elements can be embodied as representations of program instructions and data in a number of physical media, such as memory 140, non-volatile storage 150, and modulated or baseband signals, such as those on buses 183, 192, etc.

Figure 2:
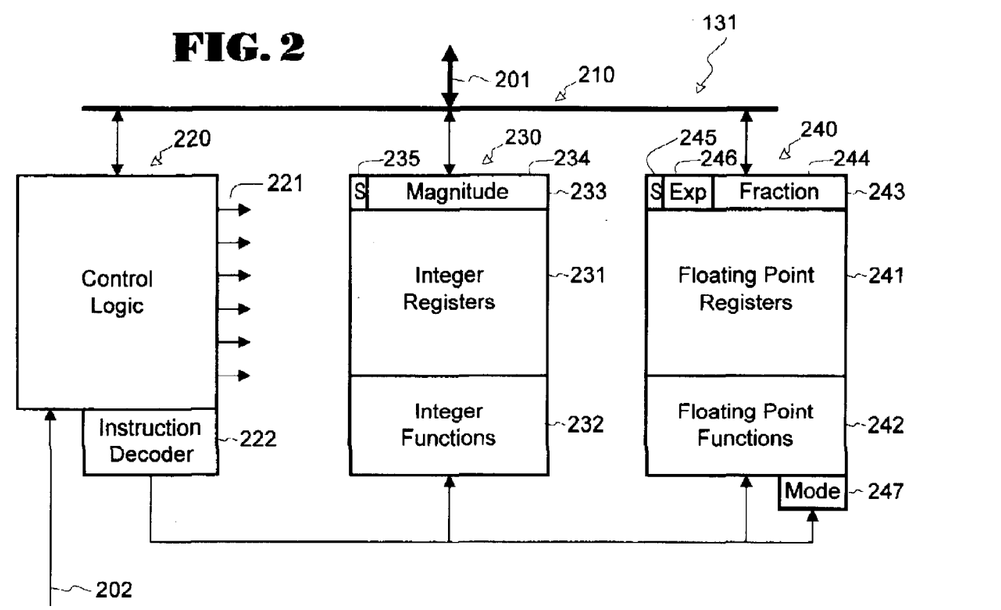
FIG. 2 shows a more detailed block diagram of a processing unit of FIG. 1.

FIG. 2 shows an illustrative processor 131, FIG. 1. Wiring 201 couples data and control signals to and from bus controller 133 with internal wiring, usually in the form of a bus 210. Control logic 220 is coupled to bus 210 and issues a large number of conventional signals 221 for controlling the other units of the processor. Clock input 202 determines the timing and sequencing of these signals. Decoder 222 translates instructions from bus 210 into sequences of control signals for carrying out the instructions.

Most processors have components for storing and manipulating data in various formats, In this example, integer unit 230 includes a file of registers 231 and a function module 232 for manipulating the contents of these registers. Integer data items (symbolized by 'I' herein) such as 233 often have a magnitude portion representing an absolute value and a separate sign bit indicating whether they are positive or negative. Other formats exist; for example, magnitudes might be offset by a known amount, negative values being represented by magnitudes less than the offset. Many processors have another unit 240 dedicated to floating-point data items. Here, a register file 241 for storing floating-point data items communicates with bus 210 and with a function module 242 for performing calculations on data items in registers 241. Floating-point data items ('X' herein) such as 243 usually contain a magnitude or fraction part 244, a sign bit 245, and an exponent 246 indicating a power of an implied base value. Particular FP formats might also include other parts or reserved bit combinations, such as indicators for overflow, underflow, and validity (e.g., not-a-number). Where specificity is required, the following description will assume for purpose of illustration that a FP data item is in the widely-used format of the ANSI/IEEE Standard 754-1985. In its 64-bit version, this standard represents a value as $(-1)^S \cdot (1+F) \cdot 2^{E-1023}$, where S is a sign bit, F designates a 52-bit fractional part, and E is an 11-bit integer exponent; the quantity 'zero', however, is represented as all zeros. The invention is independent of any particular format for floating point or integer data items. Many processors automatically convert all floating-point numbers from and to multiple formats upon moving them into and out of a register such as 243, so that all FP data items are represented in a single format within floating-point unit 240.

Often a data item in the processor's FP format must be converted to a data item in its integer format. Most processors have one or more instructions that cause function module 242 to convert a FP data item from bus 210 or registers 241 into an equivalent value in the processor's integer format 233 that can be returned to bus 210 or stored in one of the integer registers 231. However, as noted above, there are different ways to generate the integer value, and different methods can convert the same FP item into different integer values. For example a FP data item having a decimal value '377.500' becomes integer value '377' if converted by truncate or by floor method, but becomes integer '378' if converted by ceiling or by round-to-even method. Some processors, including many microprocessors, have a generic machine-level "convert-to-integer' instruction and a separate conversion-mode instruction whose argument specifies which method is to be employed by the single convert-to-integer instruction. Typically, certain bits in a control register 247 for module 242 stores a code representing the argument of the most recent conversion-mode instruction received by decoder 222. Module 242 then executes any subsequent convert-to-integer instruction according to the method whose code is currently in register 247.

The use of a generic conversion instruction along with a mode instruction decreases the total number of processor op-codes while retaining the ability to handle multiple conversion methods that different programs 110 might wish to use. Although different programs might employ different conversion methods, typically entire programs—or even entire groups of programs—use the same method throughout their code. While a processor's conversion-mode instruction typically requires a long time relative to that for other instructions, it need be executed very infrequently, so that the overall operation of any single program is not appreciably slowed.

Truncating Without Knowledge of Processor Mode

There are situations where the conversion method between floating-point and integer must be changed from one mode to another often and rapidly. Some languages, for example have implicit rules as to which method must be used. When a floating variable appears in a position requiring an integer value, Java, C, and Fortran require conversion by truncation. In a common situation, graphics programs that employ the currently favored round-to-even mode must frequently switch into and out of a line-drawing routine based upon the conventional Bresenham algorithm. For primarily historical reasons, this algorithm is based upon conversions using the truncation method. Switching repeatedly between these two methods with a large number of mode instructions significantly slows the overall program. Wrapping the drawing algorithm in its own subroutine does not usually speed up the switching, because many processors do not save and restore the contents of a conversion-mode register as a part of the processor state information. As an example, a currently available sophisticated microprocessor used in personal computers requires more than sixty machine cycles to execute a conversion-mode instruction. This instruction has a longer execution time than any other machine-level instruction except for the calculation of transcendental functions by successive approximation. The major portion of its execution concerns awaiting the resolution of out-of-order instruction execution and of predicted conditional branches. Because these capabilities will increase in future processors, it is likely that conversion-mode instructions will become even slower relative to other instructions. Rather than employing a processor's conversion instructions for truncation, the invention assembles a sequence of multiple machine-level instructions that perform the same function, but much more quickly—i.e., in fewer machine cycles—than the built-in instructions.

Figure 3:
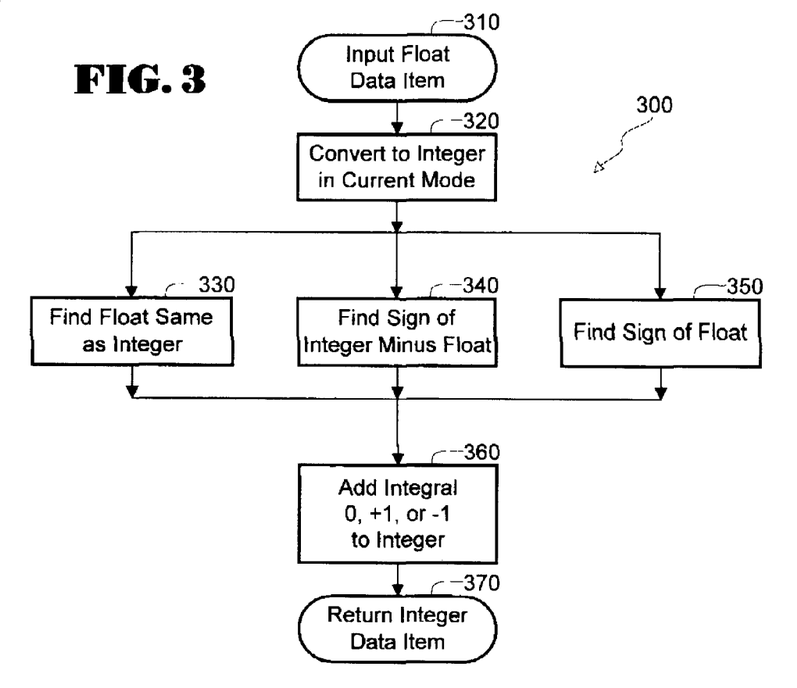
FIG. 3 is a flowchart of a method for truncating when the rounding mode is unknown.

FIG. 3 is a flowchart 300 depicting the overall method of truncating one FP data item X to its truncated integer form when the current rounding mode of the processor is either unknown, not modifiable, or in a mode other than truncate. That is, the output integer data item I is the same as the input FP data item without any fractional part that X might or might not have, when the rounding mode of the processor is neither known nor modified throughout the method. The order of the blocks is for ease of exposition, and does not itself imply any necessary sequence. The illustrative code in FIG. 4 below, for example, may perform these blocks in different sequences, and may even intermix parts of different blocks, in the interest of processor efficiency and other factors.

Block 310 inputs the FP data item. Block 320 converts it to an integer format, using the processor's floating-point-to-integer conversion instruction. Because the rounding mode is unknown, the value of the integer data item at this time might be correct, or it might be one higher or one lower than the desired truncated form of the input item. For example, if block 330 determines that there is no (floating-point) difference between X and this initial integer I, then the initial integer is output as the truncated integer data item. Block 340 performs a subtraction in floating-point mode between X and I, and finds the sign (positive or negative) of the difference, as a bit stored in the processor. Block 350 finds the sign of X alone, stored as another bit. Block 360 applies a correction factor to the initial converted integer to produce a final integer data item. Block 370 returns this final integer as the truncated integer representing the input data item X. Blocks 330–350 are shown as operating in parallel, because their order in the general method is immaterial. Particular implementation factors may determine which, if any, sequence is faster or better in some other sense. Likewise, blocks 320–350 are shown as processing operations rather than as decision blocks. Many implementations can decrease the overall time required for truncation by eschewing branch instructions altogether. Branches often slow execution considerably, especially in pipelined and parallel-execution processors.

Figure 4:
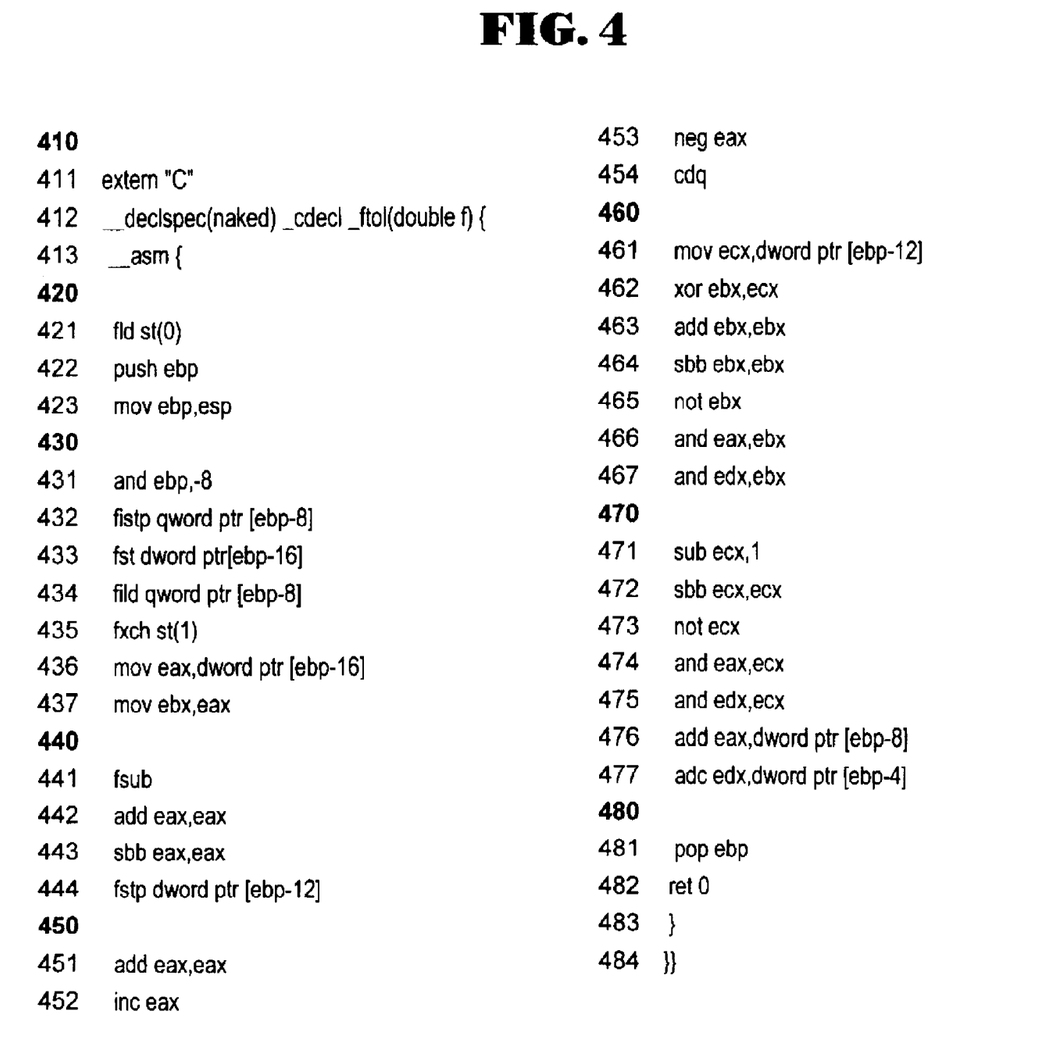
FIG. 4 lists a segment of program code for carrying out the flowchart of FIG. 3.

FIG. 4 is a code listing of a method for converting the floating-point representation of a data item in a data processor to a truncated integer representation of the data item, without switching the rounding mode of the processor, and without even any knowledge of which rounding mode the processor is currently using. The listing contains machine-level instructions executed by a Pentium® microprocessor of Intel Corporation. The detailed meanings of each of these instructions can be found in publicly available documentation. This implementation is shown in source-code form, wrapped in a C-language routine. Block 410, comprising lines 411–413, are conventional compiler directives indicating such a routine. The input floating-point data item X is assumed to be on the top of a stack in a register. Block 420 of lines 421–423 duplicate X on the stack, because the routine destroys the initial copy of X.

Line 431 in block 430 gets a 16-byte frame aligned on a quadword boundary. Line 432 converts X on the floating-point stack, placing the converted integer value in location [epb-8], using the processor's single convert-to-integer instruction "fistp" ("store integer and pop the stack"). The value left in this location is the initial value of I, which might or might not be correct. Lines 433–436 find and store a value representing the sign of X in the frame. Line 437 copies this sign value for further use.

Block 440 generates a correction value based upon the value of I–X. Line 441 subtracts the top two stack locations, leaving I–X on the stack. Line 442 is a bit-twiddler's trick for setting the carry/borrow bit if the result of line 442 is negative. Line 443 then subtracts with borrow to produce a –1 value in the register if I–X<0, and 0 otherwise. Line 444 stores the result of the subtraction, which might be +1, 0, or –1, and pops the stack. (The result has an integer value, but is in floating-point form, allowing later comparison with the floating-point input, for sign and difference determination.)

Block 450 determines the sign of the floating-point number X without any branching. Line 451 doubles the value found in line 443, which now becomes either 0 or –2. Incrementing this number in line 452 and negating it in line 453 leaves the value –1 in the eax register if X is positive, and +1 if it is negative. Line 454 converts this doubleword (32-bit) result into a quadword (64 bits) for compatibility with the format of later instructions.

In block 460, line 461 moves the result of line 432 from memory back into an integer register. Lines 462–466 determine whether or not the sign bit of I–X is the same as the sign bit of X. Line 462 exclusive-ors X (in register ebx) with the initial value of I (in ecx). Lines 463–464 set up a mask with the carry bit. If the signs differ, the negation in line 465 causes lines 466 and 467 to do nothing. If X–I has the same sign as X, then line 467 masks a nonzero quantity (+1 or a –1) to a zero. (The edx operand is an extension register holding the high-order 32 bits of the quadword whose low-order 32 bits are in the eax register. See the entry for "cdq" in Table ii below.)

Block 470 determines the final correction value for the initial value of I. Lines 471–472 sets the carry bit if I–X =0 in ecx. If I–X<>0, line 473 forms a masks of all 1-bits. Lines 474–475 enforce a zero correction when X–I=0. Lines 476 and 477 perform two 32-bit halves of a 64-bit add, which has the effect of adding the final correction factor, –1, 0, or +1, to the value of I on the stack.

Block 480 provides the calculated result. Line 481 pops the result, and line 482 returns it to the calling program. Brackets 483–484 close out the C syntax of the machine-level code.

Truncating Without Modifying Known Processor Mode

Figure 5:
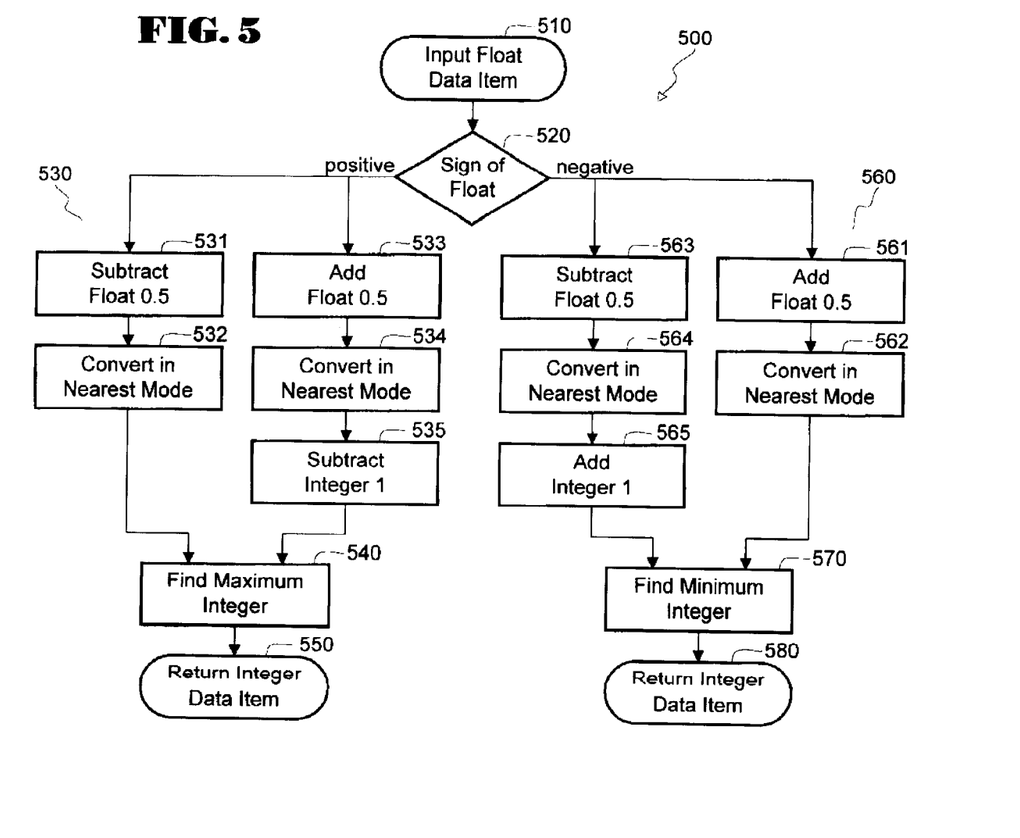
FIG. 5 is a flowchart of a method for truncating when the rounding mode is known.

FIG. 5 is a flowchart 500 depicting the overall method of truncating one FP data item X to its equivalent integer I when the rounding mode of the processor is known to be round-to-nearest, sometimes called round-to even. Even though the rounding mode is known, truncation in many processors can still be speeded up over the straightforward method of switching to truncate mode. The method shown in FIG. 5 is significantly faster than the straightforward method. It is also considerably faster in many processors than the methods shown in FIGS. 3 and 4, where the rounding mode is not known. As noted in connection with FIG. 3, the order of the blocks is for ease of exposition, and does not itself imply any necessary sequence. The illustrative code in FIG. 6 may perform these blocks in different sequences, and may intermix parts of different blocks, for processor efficiency.

Block 510 inputs the data item stored in FP format in a processor register. Block 520 represents the only decision point in the method., determining the sign of the input item X. A 'zero' input data item could be handled by either branch.

Blocks 530 produce two integer data items. Block 531 performs a subtraction of a floating-point-format representation of decimal 0.5. Block 532 then performs a conversion of this FP representation in the current rounding mode, which is known to be round-to-even, placing it in an integer register of the processor. Block 533 performs an addition operation of the same FP 0.5 representation to another stored copy of the FR representation, returning another FP-register result. Block 534 converts this FP representation to integer format in a different integer processor register. Block 535 performs a subtraction operation of an integer representation of '1' from this integer register, or decrements it.

Block 540 determines which integer register has the larger contents, and stores it. Block 550 outputs the contents as the truncated data item representing the input FP data item by exiting directly at that point. Again, blocks 530–550 operates without any explicit branch or jump instructions in the processor, thus eliminating delays due to the resolution of parallel instruction execution.

Blocks 560 perform symmetrical operations when the sign of the input data item indicates that its value is less than zero. Block 561 performs an addition of a floating-point format representation of decimal 0.5. Block 562 then performs a conversion of this FP representation in the current rounding mode, known to be round-to-even, placing it in an integer register of the processor. Block 563 performs a subtraction operation of the same FP 0.5 representation to another stored copy of the FP representation, returning another FP-register result. Block 564 converts this FP representation to integer format in a different integer processor register. Block 565 performs an addition operation of an integer representation of '1' from this integer register, or increments it. Block 570 determines which integer register has the larger contents, and stores it. Block 580 outputs the contents as the truncated data item representing the input FP data item by exiting at that point. Blocks 560–580 also operate without any explicit branch or jump instructions in the processor.

As an illustration of the cases of method 500, consider the truncation of six floating-point, numbers, shown in the column marked "F" in Table 1 below, representing non-integral, odd integral, and even integral numbers, both positive and negative.

TABLE 1

| Positive Input Data | | | | | Negative Input Data | | | | |
|---|---|---|---|---|---|---|---|---|---|
| Float | +0.5 Rnd<br>−0.5 Rnd | −1<br>= | | Max | Float | −0.5 Rnd<br>+0.5 Rnd | −1<br>= | | Min |
| +4.6 | +5.1<br>+4.1 | +5<br>+4 | +4<br>+4 | +4 | −4.6 | −5.1<br>−4.1 | −5<br>−4 | −4<br>+4 | −4 |
| +5.0 | +5.5<br>+4.5 | +6<br>+4 | +5<br>+4 | +5 | −5.0 | −5.5<br>−4.5 | −6<br>−4 | −5<br>−4 | −5 |
| +6.0 | +6.5<br>+5.5 | +6<br>+6 | +5<br>+6 | +6 | −6.0 | −6.5<br>−5.5 | −6<br>−6 | −5<br>−6 | −6 |

Figure 6:
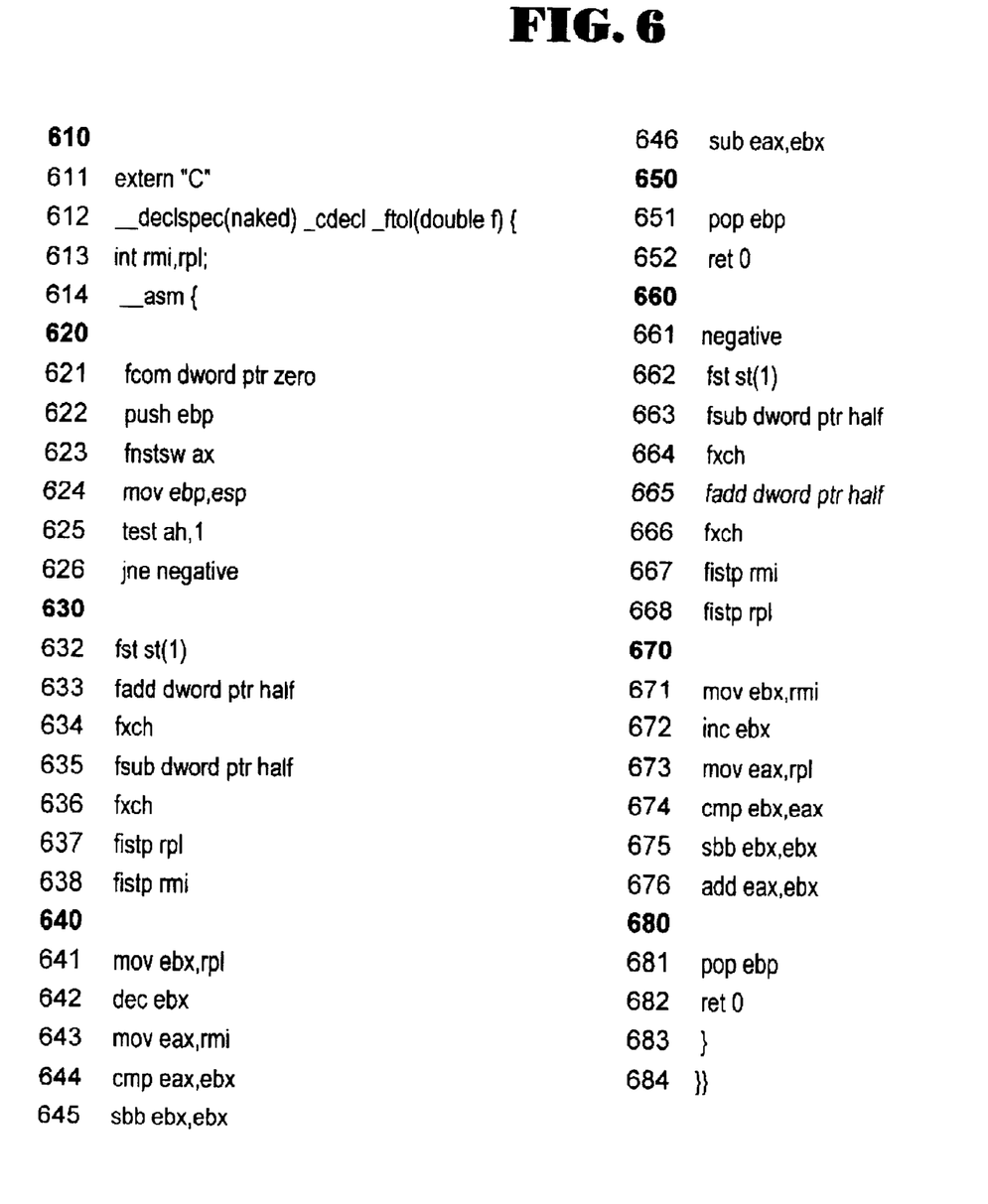
FIG. 6 lists a segment of program code for carrying out the flowchart of FIG. 3.

FIG. 6 is a code listing of a method for converting the floating-point representation of a data item in a data processor to a truncated integer representation of the data item, without switching the rounding mode of the processor, when the processor is known to be currently using the round-to-even mode. The listing contains machine-level instructions executed by a Pentium® microprocessor of Intel Corporation. This implementation is shown in source-code form, in a C-language routine. The order of the blocks is for ease of exposition, and does not itself imply any necessary sequence. Block 610, comprising lines 611–614, are conventional compiler directives indicating such a routine. The routine assumes that the input floating-point data item X is on the top of a stack in a register.

Block 620 determines which part of the routine to execute in response to the sign of the input FP item X. Line 621 compares X to a constant having the value zero, and sets processor flags accordingly. Line 622 pushes another copy of X into the stack, moves the result of the comparison to an integer register. The Pentium instruction "fnstsw ax" saves the processor's condition flags from line 621 in the ax register before handling any exceptions or executing any further instructions, so that any out-of order or parallel execution in the processor cannot alter them inadvertently before they are saved. Line 624 moves the copy of X, because ebp is a cheaper index than esp in this particular implementation. Line 625 isolates the sign bit in the ax register, leaving a "0" bit if the sign bit X is negative and a "1" otherwise. Line 626 therefore has the effect of jumping to line 661 when X is negative. Although this method could be performed entirely without using any explicit jump or branch instructions, many processors will perform the method faster if this one jump is included. Even in a processor that uses speculative execution, the branch will be not taken or correctly predicted for most input data items, so that total execution time is improved over other methods that might add complexity in order to eliminate this jump.

If the input data item is not negative, execution continues at line 632 of block 630. (Line 631 is a comment for clarity of exposition.) This block produces the two auxiliary data items noted in blocks 531–534, FIG. 5. Line 632 makes an extra copy of the FP item. Line 633 adds a bit pattern named "half" representing a floating-point quantity 0.5 to Lines 634–636 subtract the same bit pattern in an efficient manner. Lines 637–638 then employ the FP-to-integer conversion instruction "fistp," which is, as stated above, is assumed to have been set to a round-to-even mode before the beginning of the routine of FIG. 6. The "p" suffix on "fistp" also pushes these two items on the stack as "rpl" (the real item plus an offset), and "rmi", both in integer format.

Block 640 performs the tasks of blocks 535 and 540 in FIG. 5. Line 641 moves the integer representation of rpl to another integer register, and line 642 decrements it. Line 643 moves the unaltered version of rmi to an integer register. Lines 644–646 have the effect of determining which of these two registers contains data representing the larger of these two integer items. Line 644 sets or resets the carry bit in response to a comparison. Line 645 subtracts a register from itself using the carry (borrow) bit, in order to leaves a bit pattern representing integer "−1" in the register if the register containing "rpl-1" represents a larger integer than does the register holding rmi, and a "0" otherwise. Line 646 then in effect finds the maximum by subtracting either integer "0" or integer "−1" from the register containing rmi. Because the maximum and minimum integers either differ by unity or do not differ at all, line 646 has the effect of adding unity to the smaller integer if it differs from the larger, or adding nothing if the two integers are the same.

Block 650 returns the correct truncated result. Line 651 pops the result of line 646 from the stack. Line 652 returns the result to the calling routine and exits.

Blocks 660–680 mirror blocks 630–650 for the case where the form of the input FP data item indicates that its value is negative, for carrying out blocks 560–580 of FIG. 5.

In block 660, lines 663 and 665 first subtract and then add the constant "half," the reverse order from that of corresponding lines in block 630. In block 670, lines 671–672 move rmi into an integer register and increment it (whereas lines 641–642 moved rpl and decremented it). Line 676 forms incorporates the correction, integer "0" or "−1", by adding it to the representation of rpl, rather than by subtracting it from rmi as was done in line 646. Block 680 pops and returns the correct truncated integer result. Duplicating block 650 in block 680 speeds the execution by avoiding a jump to a common exit; only one of these blocks is executed for any input data item. Brackets 683–684 close out the C syntax of the machine-level code.

Table ii below describes the relevant actions of the Pentium instructions used in the methods shown in FIGS. 4 and 6, in order to facilitate translating these methods to execute on other processors. Where an instruction combines two operands, it leaves the result in the location of the first operand, unless otherwise specified.

TABLE ii

| | |
|---|---|
| adc | Adds two integer operands and the carry flag. Affects the carry and sign flags. |
| add | Adds two integer operands without the carry bit. Affects the carry and sign flags. |
| and | Performs a bitwise 'and' of two operands, storing the result in the first operand. Affects the sign and zero flags. |
| cdq | Converts a double-word (32 bits) in a register (here, eax) to a quad word (64 bits) in the register and an extension register (here edx), by copying the sign bit in eax to every bit position in the edx register. |
| cmp | Compares to operands by subtracting the second from the first, without altering either. Affects the condition flags. |
| dec | Decrements the operand by integer "1". Does not affect the carry flag. |
| fadd | Adds two floating-point operands without the carry bit. Affects the carry and sign flags. |
| fcom | Compares a floating-point value on the stack to its operand. Affects the FP status bits. |
| fild | Converts its signed-integer operand into a floating form. Stores the result in the FP register stack. |
| fistp | Converts a floating-point value on the stack to an integer and pops the stack. Stores the result in a location specified by its operand. The conversion is performed according to one of several rounding modes previously set by another instruction. |
| fld | Copies its operand onto the top of the floating-point stack. |
| fnstsw | Copies the floating-point condition flags to a location specified by its operand, without handling exceptions and without executing any other instruction before the flags are stored. |
| fst | Copies the top of the floating-point stack to a location specified by its operand. |
| fstp | Copies the top of the floating-point stack to a location specified by its operand, and pops the stack. |
| fsub | Subtracts the second floating-point operand from the first floating–point operand. If there is only one operand, the instruction subtracts a specified memory location from the top of the floating-point stack, leaving the result on the stack. |
| fxch | Exchanges the top two locations on the floating-point stack with each other. |
| inc | Increments the operand by integer "1". Does not affect the carry flag. |
| jne | Jumps to a location specified by the operand, if the 'zero' condition flag is not set. |
| mov | Copies the second operand to a location specified by the first operand. |
| neg | Replaces the operand with its two's complement. Condition flags are set or reset according to the result. |
| not | Replaces the operand with its one's complement. Condition flags are not affected. |
| pop | Moves the top of the stack to the operand location, then pops the stack pointer. |
| push | Pushes the stack pointer, then copies the operand to the top of the stack. |
| ret | Transfers program control to a location on the top of the stack. |
| sbb | Subtracts the sum of the second operand and the carry flag from the first operand, and stores the result in the first operand. Affects the condition flags. |
| sub | Subtracts the second operand from the first operand, and stores the result in the first operand. Affects the condition flags. |
| test | Performs a bitwise 'and' of its two operands. Affects the condition flags, but discards the result. |
| xor | Performs a bitwise 'exclusive-or' of two operands, storing the result in the first operand. Affects the condition flags; the carry flag is cleared. |

CONCLUSION

The present invention converts a floating-point data item into a truncated integer data item, without switching processor rounding modes, or on processors where a truncation mode does not exist or is difficult to specify or to execute. Sufficient information is given to allow implementation of the invention for other processors and processor architectures. The invention can also be performed by instructions at levels higher or lower than the machine or assembler level of a processor, for example, in a language such as C or in microcode.

I claim as my invention:

1. A method of converting a floating-point input data item into a truncated integer output data item in a programmed digital data processor having multiple rounding modes including a round-to-even mode, without modifying the rounding mode of the processor, comprising:
   if the rounding mode of the processor is currently round-to-even,
      determining a property of the input floating-point representation;
      producing at least two intermediate floating-point representations from the input floating-point representation;
      converting the intermediate floating-point representations to intermediate integer representations in the round-to-even-mode mode;
      in response to the property of the input floating-point representation, selecting one of the intermediate integer representations as an integer representation of the output data item;
   if the current rounding mode is other than round-to-even,
      converting a floating-point representation of the input data item to an intermediate integer representation in a current one of the multiple rounding modes, selecting one of a plurality of correction factors in response to a number of properties of the representations of the input data and the intermediate integer, combining the selected correction factor with the intermediate integer representation to form an integer representation of the output data item.

2. The method of claim 1 where the rounding modes of the processor include a truncate mode.

3. The method of claim 1 where the rounding modes of the processor include at least one round-to-infinity mode.

4. A medium bearing instructions and data for causing a suitably programmed digital computer to carry out the method of claim 1.

5. The method of claim 4 where the medium is a device for storing digital information.

6. The method of claim 4 where the medium is a signal for transmitting digital information.

7. A method of converting a floating-point input data item into a truncated integer output data item in a programmed digital data processor having multiple rounding modes, without modifying the rounding mode of the processor, comprising:

converting a floating-point representation of the input data item to an intermediate integer representation in a current one of the multiple rounding modes, selecting one of a plurality of correction factors in response to a number of properties of the representations of the input data and the intermediate integer, combining the selected correction factor with the intermediate integer representation to form an integer representation of the output data item.

8. The method of claim 7 where all of the steps are performed independently of which one of the rounding modes is in effect in the processor.

9. The method of claim 7 where the properties include at least one indication as to the relative size of the floating-point representation and the intermediate integer representation.

10. The method of claim 9 where the indication indicates whether or not the floating-point representation represents the same magnitude as the intermediate integer representation.

11. The method of claim 10 where the indication indicates which of the floating-point representation and the intermediate integer representation represents a larger magnitude.

12. The method of claim 7 where the properties include an indication representing the sign of the floating-point representation.

13. The method of claim 7 where the plurality of correction factors includes a representation for a 'zero' magnitude in an integer format.

14. The method of claim 13 where the plurality of correction factors includes a representation for a 'one' magnitude in an integer format.

15. The method of claim 14 where the representation for the 'one' magnitude represents a negative quantity.

16. The method of claim 14 where the representation for the 'one' magnitude represents a positive quantity.

17. A medium bearing instructions and data for causing a suitably programmed digital computer to carry out the method of claim 7.

18. A method of converting a floating-point input data item into a truncated integer output data item in a programmed digital data processor having a round-to-nearest rounding mode currently in effect in the processor, without modifying the rounding mode of the processor, comprising:

determining a property of the input floating-point representation;

producing at least two intermediate floating-point representations from the input floating-point representation;

converting the intermediate floating-point representations to intermediate integer representations in the round-to-even-mode mode;

in response to the property of the input floating-point representation, selecting one of the intermediate integer representations as an integer representation of the output data item.

19. The method of claim 18 where the intermediate floating-point representations represent quantities different from the input floating-point representation and different from each other.

20. The method of claim 19 where the intermediate floating-point representations both represent quantities differing from the input floating-point representation by a constant amount.

21. The method of claim 18 where the property of the input floating-point representation is a sign indicator associated therewith.

22. The method of claim 21 further comprising:

selecting one of the intermediate integer representations in response to the sign indicator;

modifying the selected intermediate representation.

23. The method of claim 18 where selecting one of the intermediate integer representations comprises:

determining the relative magnitudes represented by the intermediate representations;

choosing that one of the intermediate representations having a predetermined relative magnitude.

24. The method of claim 23 further comprising modifying one of the intermediate integer representations before determining the relative magnitudes.

25. The method of claim 24 where the one of the intermediate integer representation is modified by an integer unity representation.

26. The method of claim 23 where the property of the input floating-point representation indicates a magnitude represented by the input floating-point representation, and where the relative magnitude is determined in response to the property.

27. The method of claim 18 where the selected one intermediate integer representation represents a larger of the intermediate integer representations for a first value of the property.

28. The method of claim 27 where the selected one intermediate integer representation represents a smaller of the intermediate integer representations for a second value of the property.

29. A medium bearing instructions and data for causing a suitably programmed digital computer to carry out the method of claim 18.

30. A system for converting a floating-point input data item into a truncated integer output data item, comprising:

a mode register for specifying multiple rounding modes for floating-point data;

a floating-point unit for receiving the input data item, for determining a plurality of properties of the input data item, and for converting the input data item to an intermediate integer in response to a current mode stored in the mode register;

an integer unit for receiving the intermediate integer, for selecting one of a plurality of correction factors in response to the properties, and for combining the selected correction factor with the intermediate integer representation to form an integer representing the output data item.

31. The system of claim 30 where the floating-point unit includes a plurality of registers, one of which receives the input data item.

32. The system of claim 31 where the integer unit includes a plurality of registers, one of which holds the output data item.

33. The system of claim 31 further comprising logic including an instruction decoder for controlling the mode register, floating point unit, and the integer unit.

34. A system for converting a floating-point input data item into a truncated integer output data item, comprising:

a mode register for specifying multiple rounding modes for floating-point data, the modes including a round-to-even mode;

a floating-point unit for receiving the input data item, for determining a property of the input data item, for producing at least two intermediate floating-point data items from the input floating-point representation, and for converting the intermediate floating-point items to intermediate integer data items in the round-to-even mode mode;

an integer unit for receiving the intermediate integer items, and for selecting one of the intermediate integer items as the output data item in response to the property of the input data item.

35. The system of claim 34 where the floating-point unit includes a plurality of registers, one of which receives the input data item.

36. The system of claim 34 where the integer unit includes a plurality of registers, one of which holds the output data item.

37. The system of claim 34 further comprising logic including an instruction decoder for setting the mode register to the round-to-even mode.

38. A medium bearing instructions and data for causing a suitably programmed digital computer having multiple rounding modes, including a round-to-even mode, to carry out a method of converting a floating-point input data item into a truncated integer output data item without modifying the rounding mode of the processor, the method comprising:

if the rounding mode of the processor is currently round-to-even,
determining a property of the input floating-point representation;
producing at least two intermediate floating-point representations from the input floating-point representation;
converting the intermediate floating-point representations to intermediate integer representations in the round-to-even-mode mode;
in response to the property of the input floating-point representation, selecting one of the intermediate integer representations as an integer representation of the output data item;

if the current rounding mode is other than round-to-even,
converting a floating-point representation of the input data item to an intermediate integer representation in a current one of the multiple rounding modes,
selecting one of a plurality of correction factors in response to a number of properties of the representations of the input data and the intermediate integer,
combining the selected correction factor with the intermediate integer representation to form an integer representation of the output data item.

39. A medium bearing instructions and data for causing a suitably programmed digital computer having multiple rounding modes to carry out a method of converting a floating-point input data item into a truncated integer output data item without modifying the rounding mode of the processor, the method comprising:

converting a floating-point representation of the input data item to an intermediate integer representation in a current one of the multiple rounding modes, selecting one of a plurality of correction factors in response to a number of properties of the representations of the input data and the intermediate integer, combining the selected correction factor with the intermediate integer representation to form an integer representation of the output data item.

40. A medium bearing instructions and data for causing a suitably programmed digital computer having at least a round-to-nearest rounding mode to carry out a method of converting a floating-point input data item into a truncated integer output data item, the method comprising:

determining a property of the input floating-point representation;

producing at least two intermediate floating-point representations from the input floating-point representation;

converting the intermediate floating-point representations to intermediate integer representations in the round-to-even-mode mode;

in response to the property of the input floating-point representation, selecting one of the intermediate integer representations as an integer representation of the output data item.

\* \* \* \* \*

UNITED STATES PATENT AND TRADEMARK OFFICE
CERTIFICATE OF CORRECTION

PATENT NO.     : 6,535,898 B1
DATED          : March 18, 2003
INVENTOR(S)    : Yuval It is certified that error appears in the above-identified patent and that said Letters Patent is hereby corrected as shown below:

<u>Column 9,</u>
Line 43, in the table containing "Negative Input Data", delete "-1" in the fourth column and insert -- +1 --.
Line 46, in the table containing "Negative Input Data", delete "+4" in the fourth column, and insert -- -4 --.

Signed and Sealed this

Second Day of September, 2003

JAMES E. ROGAN
*Director of the United States Patent and Trademark Office*